(12) United States Patent
Evans

(10) Patent No.: US 6,763,316 B2
(45) Date of Patent: Jul. 13, 2004

(54) METHOD FOR MEASUREMENT OF BEAM EMITTANCE IN A CHARGED PARTICLE TRANSPORT SYSTEM

(75) Inventor: Louis Edward Evans, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 10/103,583

(22) Filed: Mar. 21, 2002

(65) Prior Publication Data

US 2003/0191899 A1 Oct. 9, 2003

(51) Int. Cl.[7] ............................ G01K 11/30; G01K 1/08
(52) U.S. Cl. ...................... 702/134; 204/180; 250/398; 250/492.2; 324/71.3
(58) Field of Search .................... 702/57, 100, 130, 702/134; 324/71.4; 328/237; 250/396, 397, 398, 492.2, 305; 204/180

(56) References Cited

U.S. PATENT DOCUMENTS

| | | | | |
|---|---|---|---|---|
| 3,663,395 A | * | 5/1972 | Strickler | 204/180 |
| 4,396,841 A | * | 8/1983 | Razin et al. | 250/396 |
| 4,608,537 A | * | 8/1986 | Mako et al. | 328/237 |
| 4,629,975 A | * | 12/1986 | Fiorito et al. | 324/71.3 |
| 5,039,861 A | * | 8/1991 | Swenson | 250/397 |
| 5,045,695 A | * | 9/1991 | Rule et al. | 250/305 |
| 5,977,550 A | * | 11/1999 | Nakasuji | 250/492.2 |
| 6,486,479 B1 | * | 11/2002 | Oae et al. | 250/492.2 |
| 6,528,799 B1 | * | 3/2003 | Katsap et al. | 250/398 |

* cited by examiner

*Primary Examiner*—John Barlow
*Assistant Examiner*—John Le

(57) ABSTRACT

A method determines ion beam emittance, i.e., the beam current density based on position and angle, in a charged particle transport system. The emittance is determined from variations in the current measured in a slot Faraday or sample cup as a straight-edged mechanism traverses the beam upstream of the sample cup in a direction perpendicular to the orientation of the slot Faraday and the straight-edged mechanism, which also can be the direction in which the emittance is determined. An expression in terms of the beam current density can be determined for the derivative of the sample current with respect to position of the mechanism. Depending on the angular spread of the beam reaching the sample cup, the density can be determined directly from the derivative, or can be determined using a least squares analysis of the derivative over a range of mechanism positions.

26 Claims, 4 Drawing Sheets

METHOD FOR MEASUREMENT OF BEAM EMITTANCE IN A CHARGED PARTICLE TRANSPORT SYSTEM

RELATED APPLICATIONS

Not Applicable

FIELD

The methods and systems relate to charged particle transport and more specifically to measuring beam emittance in a charged particle transport system.

BACKGROUND

Ion implantation is a standard technique generally used for modifying surface properties of materials. In the semiconductor industry, ion implantation techniques are used for introducing conductivity-altering dopant materials into semiconductor wafers. In a conventional ion implantation system, a desired dopant material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material.

The angle at which the ions forming the beam strike the wafer can determine the extent to which the ions penetrate the wafer. For some applications, it may be necessary to control ion penetration down to the nanometer scale. It can be readily appreciated that even slight deviations in the ion beam axis, or divergence or convergence in the beam itself can result in undesirable results.

Presently, measurements of the divergence or convergence, i.e., angular spread, in the beam at the wafer may not be able to be obtained for some implantation equipment. Thus, confirmation of ion implantation within desired specifications or equipment performance monitoring might not be possible. Further, there may be no way to measure directly the mean direction of the beam with respect to the beamline axis, which can determine the actual implant angle on the wafer. Tilt axis settings available on some equipment, if calibrated properly, may establish these angles with respect to the beamline axis only. However, any deviation of the beam from this direction constitutes an error in the implant angle.

SUMMARY

A method for determining beam emittance at a plane in a charged particle transport system, comprises measuring the beam current reaching a current sensor as a moving, straight-edged mechanism traverses the beam in a plane upstream of the sensor; numerically determining a derivative of the measured beam current with respect to the position of the mechanism; determining if there is a position of the mechanism at which the range of angles in the portion of the beam reaching the current sensor falls within the angle subtended at the current sensor by the two edges of the mechanism; determining, based on the derivative, a beam current density $\rho$ corresponding to the beam emittance, when there is a position of the mechanism at which the range of angles in the portion of the beam reaching the current sensor falls within the angle subtended at the current sensor by the two edges of the mechanism; and determining, when there is no position of the mechanism at which the range of angles in the portion of the beam reaching the current sensor falls within the angle subtended at the current sensor, the beam current density by performing curve fitting techniques on the derivative of the beam current profile over a range of positions for which the mechanism intercepts beam current that would otherwise reach and be counted by the current sensor.

In one embodiment, the derivative is given by:

$$\frac{dI}{dx} = \rho_{\substack{left \\ edge}} * d\theta_{\substack{left \\ edge}} - \rho_{\substack{right \\ edge}} * d\theta_{\substack{right \\ edge}},$$

where $$d\theta_{\substack{left \\ edge}} \text{ and } d\theta_{\substack{right \\ edge}}$$

are the angles subtended by the downstream current sensor to the left and right edges of the mechanism, respectively, and $$\rho_{\substack{left \\ edge}} \text{ and } \rho_{\substack{right \\ edge}}$$

are the current densities in the beam passing left and right edges, respectively, of the mechanism, as it moves to the right through the beam. I is the current measured by the downstream sensor, and x is the position of the mechanism in the direction of its travel.

BRIEF DESCRIPTION OF THE DRAWINGS

The following figures depict certain illustrative embodiments in which like reference numerals refer to like elements. These depicted embodiments are to be understood as illustrative and not as limiting in any way.

DETAILED DESCRIPTION OF THE PREFERRED EMBODIMENTS

Figure 1:
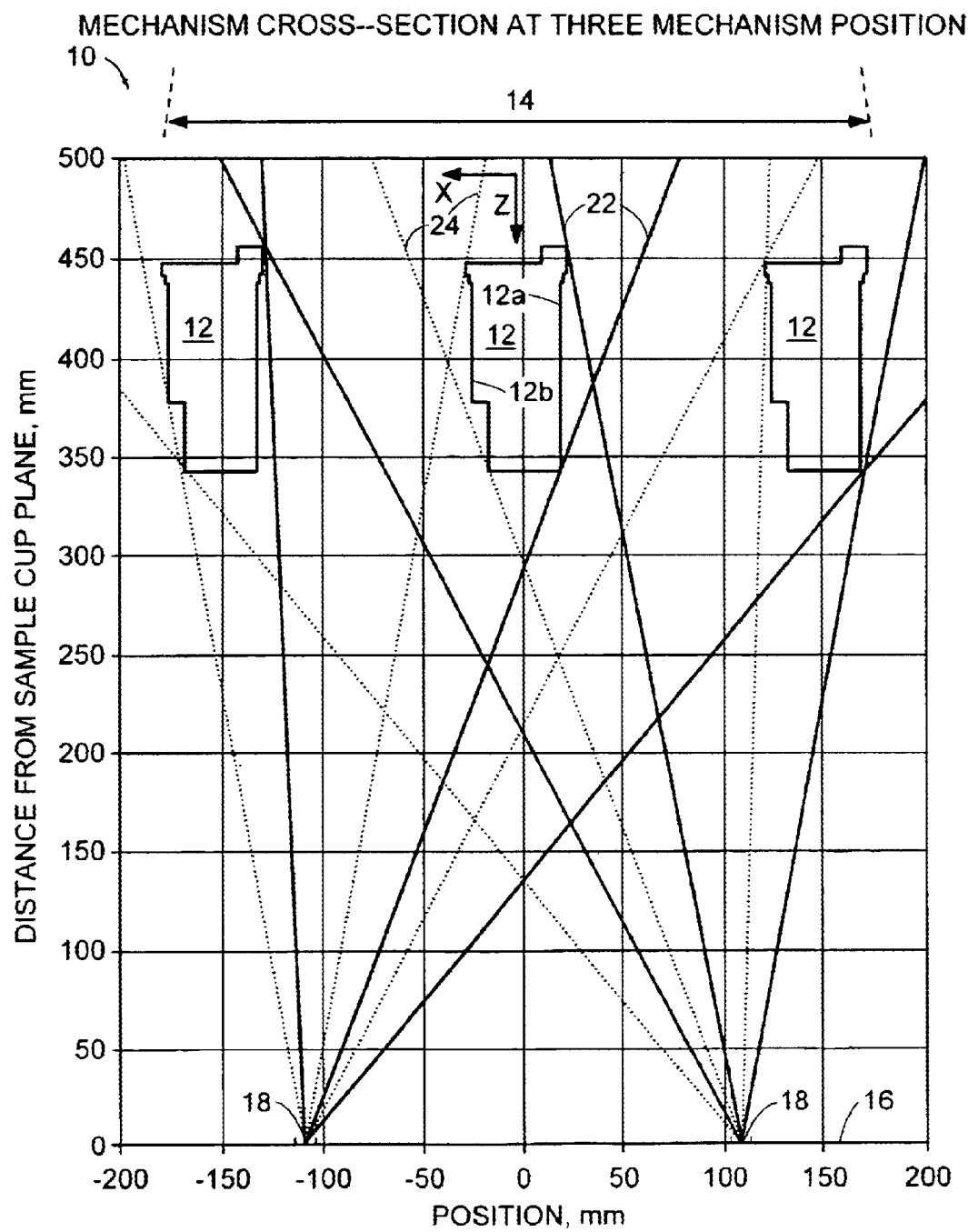
FIG. 1 shows a schematic representation of an ion implantation device having a mechanism that can be moved within the ion beam.

Ion implantation equipment currently in use typically may be capable of providing measurements of beam current at one or more positions along the beam path. In some instances, these current measuring components, i.e., current sensors or Faradays, may be designed to measure the entire beam current, and in other instances a small Faraday or sample cup with a narrow slot for an aperture may be used to sample the beam at one particular coordinate with respect to the beamline axis. It can be understood that current sensors having a variety of shapes and sensing means may be used. The description herein with reference to a Faraday, or sample cup, may provide a known example of a current sensor, but the method and system may not be limited thereto.

When the beam upstream of such a sample cup is traversed by an aperture or obstacle moving perpendicular to the long dimension of the sample cup, ion beam emittance, i.e., the beam current density as a function of position and direction, may be determined from variations in the current measured at the sample cup as the aperture or obstacle traverses the beam, for positions of the leading and/or trailing edges of the aperture or obstacle intercepting the beam and directions (angles with respect to the beamline axis) along a line in the position-angle emittance plane.

If the beam is directed primarily along its axis in the z direction, with the aperture or obstacle moving across the beam in the x direction, and the sample cup slot long dimension oriented in the y direction, the current density as a function of position (x,z) of the leading and trailing edges of the aperture or obstacle and direction (θ) from the leading and trailing edges to the sample cup may be determined. The angle θ is the angle between an element of beam and the z-axis in the x-z plane. At different x positions in its travel, different corners of the aperture or obstacle, at different z coordinates, may define the leading and trailing edges intercepting the beam. Beam current density data for these different z coordinates may be transformed to a common x-y plane (common z-coordinate), where the data points will fall on a nearly straight line in the position-angle (x-θ) emittance plane.

Multiple sample cups at different x coordinates may be used to determine beam current densities along roughly parallel lines in the (x-θ) emittance plane, from which a 2-dimensional (x-θ) map of beam current density, sometimes called an emittance plot, may be generated. The density of data points in this map will depend on the number and spacing of the sample cups used and on the incremental change in aperture or obstacle position between current measurements as the aperture or obstacle traverses the beam. In an embodiment of a method described herein, one-dimensional emittance can be determined for devices using a slot Faraday or sample cup and a moving straight-edged obstacle, both oriented perpendicular to the direction of travel of the obstacle, which also is the coordinate direction for which the emittance is determined.

FIG. 1 shows a process chamber 10 of an implanting device, with a movable straight-edged mechanism 12, shown in cross-section at three positions along a line parallel to the back plane 16 of the process chamber 10. It can be understood that the expressions derived herein may be applicable to configurations other than that shown in FIG. 1. Mechanism 12 can be moved in the path of ion beam 14, and in doing so act as an obstacle, blocking some of the beam current that would otherwise reach back plane 16. Current collected by one or more sample cups 18 at back plane 16 may change as a result of the movement of the mechanism, as the mechanism intercepts current that would otherwise reach the sample cups 18. It can be understood that the method and expressions derived generally can be applicable to implanting devices and other charged particle transport systems where current measurements are obtainable using a slot Faraday or sample cup and either a moving straight-edged aperture or a moving straight-edged obstacle.

At a position (x,y,z) in the beam 14 there will be a range of divergences θ, φ, with respect to the z axis, and a 4-dimensional "phase space" current density, which can be based on position (x,y) and direction (θ, φ), and which represents how the beam current is distributed in directions θ and φ at the position (x,y,z). The divergence θ is the angle in the x-z plane with respect to the z-axis, and φ is the angle in the y-z plane with respect to the z-axis. The beam line axis is along the z direction.

The beam current density in 2-dimensional x,y space can be obtained from the 4-dimensional phase space density by integrating the phase space density over the two divergence dimensions θ and φ. Similarly, a 2-dimensional phase space current density can be obtained by integrating over position and divergence in one coordinate to get the density as a function of the other position and divergence (integrate over x and θ to get density as a function of y and φ, or integrate over y and φ to get density as a function of x and θ). The method described herein can be used to determine such a 2-dimensional (one position coordinate and one divergence coordinate) phase space current density, for position and angle coordinates in the direction of motion of the moving mechanism 12.

The integration over the other "unwanted" position and divergence coordinates is accomplished by the use of a slot faraday or sample cup 18, which must be long enough in the unwanted dimension to collect current over the full range of position and divergence in that dimension and a mechanism 12 with straight edges parallel to the unwanted dimension and long enough to block current over the full range of position and divergence in that dimension. The current passing through an element of width dx at (x, z) and reaching an element of width dw in a plane downstream of z, where the line from (x,z) to dw makes an angle θ in the x-z plane with the z axis, is the two-dimensional phase space density $\rho(x, \theta)$ multiplied by the product of dx and the angle dθ subtended at (x,z) by the downstream element dw.

$$dI = \rho(x,\theta) dx d\theta \tag{1}$$

As noted, mechanism 12 can block part of the beam 14, reducing the amount of current that would otherwise be collected by a sample cup 18 located on back plane 16. Referring again to FIG. 1, at a position of mechanism 12, there is a range of angles over which a part of the beam 14, which otherwise would reach a sample cup 18, will be intercepted by the mechanism 12 and prevented from reaching the sample cup 18. The limits of this range of angles are indicated in FIG. 1 by the solid lines 22 and the dashed lines 24 from the two sample cups 18 shown to the limiting corners of the mechanism 12 at each position. (For the sake of clarity, reference numbers may be shown only in relation to the central position of mechanism 12 in FIG. 1.) The solid lines 22 represent the limiting angle to the right edge 12a of the mechanism 12, and the dashed lines 24 represent the limiting angle to the left edge 12b. At a sample cup 18 position on the back plane 16, the mechanism 12 can block beam 14 within the range of angles between lines 22 and 24 that would otherwise reach that position on the back plane 16. Beam 14 coming to that position from other angles, i.e. from the left of the line 24 and from the right of the line 22 crossing that position on the back plane 16, will not be intercepted by the mechanism 12.

At a position on the back plane 16 and for a given mechanism 12 position, each of the two limiting angles can be determined by one particular corner of the mechanism 12 cross-section, at position ($x_{corner}$, $z_{corner}$). It can be seen from FIG. 1 that the limiting angles are defined by different corners of the mechanism, with different coordinates ($x_{corner}$, $z_{corner}$) at different mechanism 12 positions. The limiting angle, θ, is the inverse tangent of the ratio of the horizontal distance from the mechanism 12 corner, $x_{corner}$, to the point x in the back plane 16, or sample cup plane 16, divided by the distance along the beam line from the sample cup plane 16 to the mechanism 12 corner, $z_{corner}$:

$$\theta = \tan^{-1}\left(\frac{x - x_{corner}}{z_{corner}}\right). \tag{2}$$

In the limit of small angles, for which tan θ≈θ, and over a range of positions x for which a given mechanism 12 edge determines the limiting angle, the angle θ becomes a linear function of x, with a slope equal to $1/z_{corner}$. As the position x at sample cup plane 16 changes, this corner of the mechanism 12 may continue to define the limiting angle until the line 22 or 24 from x (at the sample cup plane 16) to that corner intersects another corner, after which this other corner will define the limiting angle. With the definition given in (2), angles are positive for ions moving to the right (positive x-direction, $x>x_{corner}$) as they move down the beamline.

As the mechanism 12 moves a distance $dx_{mechanism}$ to the right in FIG. 1, the corner of the mechanism 12 that defines the right edge of the mechanism 12 (as seen from the sample cup 18) moves from ($x_{right}$, $z_{right}$) to ($x_{right}+dx_{mechanism}$, $z_{right}$) and intercepts the current that would otherwise pass through this $dx_{mechanism}$ at ($x_{right}$, $z_{right}$) and reach the sample cup 18. This causes the current measured at the sample cup 18 to decrease by an amount $dI_{right}$, where:

$$dI_{right} = \rho_{right\ edge}(x_{right}, \theta_{right}, z_{right}) dx_{mechanism} d\theta_{right} \text{ and} \quad (3)$$

$d\theta_{right}$ is the angle subtended by the sample cup 18 at the position ($x_{right}$, $z_{right}$). At the same time, the corner of the mechanism 12 that defines the left edge of the mechanism 12 (as seen from the sample cup) moves from ($x_{left}$, $z_{left}$) to ($x_{left}+dx_{mechanism}$, $z_{left}$) and allows the current in this $dx_{mechanism}$ at ($x_{left}$, $z_{left}$) that formerly was prevented from reaching the sample cup by the presence of the mechanism 12 to reach the sample cup. This causes the current measured at the sample cup to increase by an amount $dI_{left}$, where:

$$dI_{left} = \rho_{left\ edge}(x_{left}, \theta_{left}, z_{left}) dx_{mechanism} d\theta_{left}. \quad (4)$$

The net change in current reaching the sample cup as a result of the mechanism 12 motion through distance $dx_{mechanism}$ is the amount $dI_{left}$ added on the left edge, minus the amount $dI_{right}$ subtracted at the right edge:

$$dI = dI_{left} - dI_{right} \quad (5)$$

$$= dx_{mechanism}\left\{\rho_{left\ edge}(x_{left}, \theta_{left}, z_{left})d\theta_{left} - \rho_{right\ edge}(x_{right}, \theta_{right}, z_{right})d\theta_{right}\right\}.$$

The derivative of sample cup 18 current with respect to position of the mechanism is given by:

$$\frac{dI}{dx_{mechanism}} = \rho_{left\ edge}(x_{left}, \theta_{left}, z_{left})d\theta_{left} - \rho_{right\ edge}(x_{right}, \theta_{right}, z_{right})d\theta_{right}. \quad (6)$$

If the mechanism 12 were an aperture rather than an obstacle, the sign on the density (ρ) terms on the right hand side of equations (5) and (6) would be reversed, since then current would be added at the right edge and subtracted at the left edge as the mechanism 12 moves to the right.

If the range of divergences in the beam 14 that would otherwise reach the sample cup 18 is small enough, there may be some range of mechanism 12 positions for which this range of angles will fall within the angle subtended by the two edges of the mechanism 12 at the sample cup 18, i.e. within the range of angles between the lines 22 and 24 in FIG. 1. Within this range of mechanism 12 positions, if the mechanism 12 is an obstacle, it will intercept all of the beam current that would otherwise reach the sample cup 18, or, if it is an aperture, it will intercept none of the beam current that would otherwise reach the sample cup 18. For mechanism 12 positions to the left of this range, only the right edge of the mechanism 12 will intercept beam 14 current that would otherwise reach the sample cup 18, and for positions to the right of this range, only the left edge of the mechanism 12 will intercept beam 14 current that would otherwise reach the sample cup 18. Under these conditions, there will be no point in the mechanism travel at which both left and right edges of the mechanism 12 are simultaneously intercepting beam current that would otherwise reach the sample cup 18, and the derivative equation (6) above will have no more than one non-zero term on the right hand side at any position.

Figure 2A:
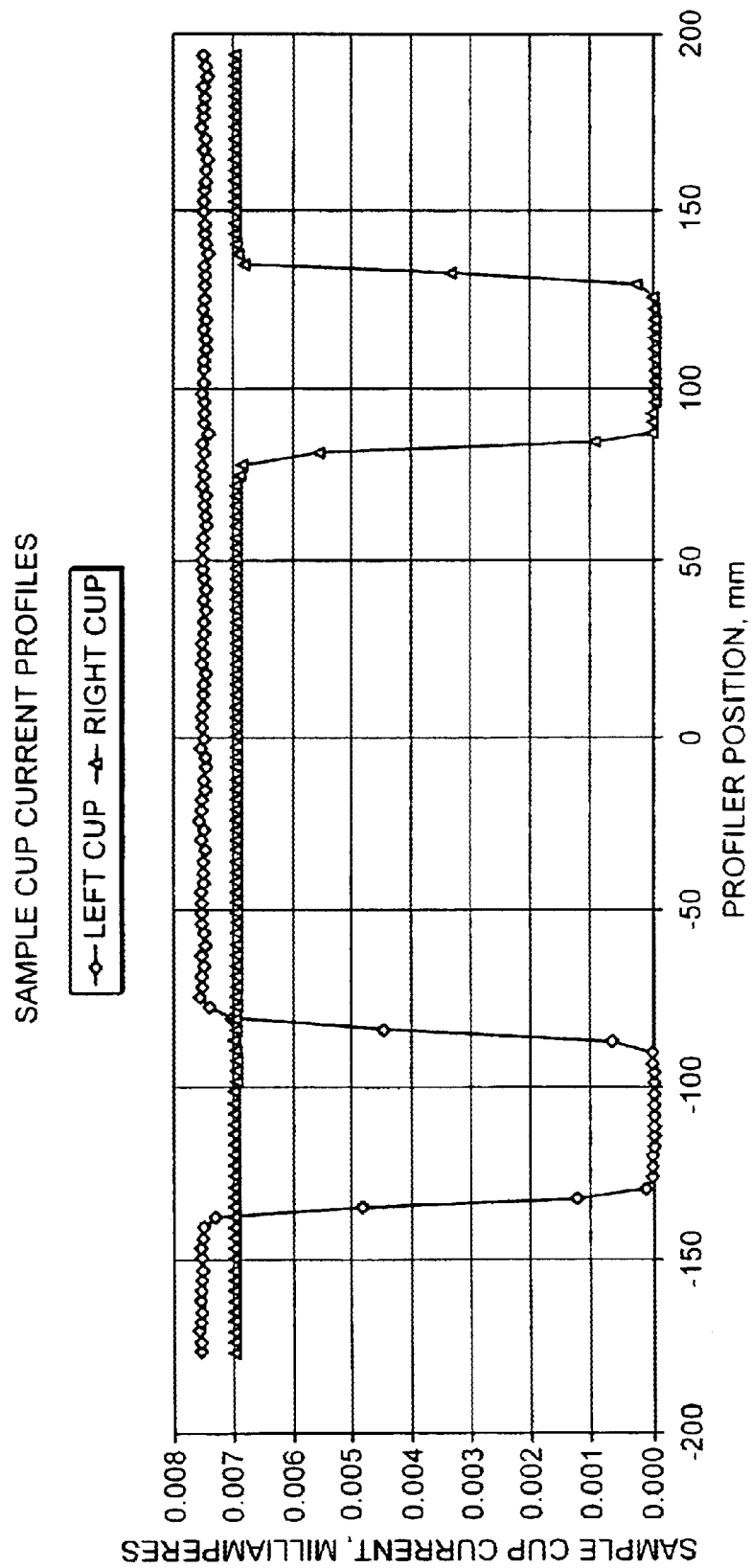
FIGS. 2a and 2b are sample current profiles for an ion implantation device.

A typical sample cup current profile for these conditions may be shown in FIG. 2a. In this case, the mechanism 12 is an obstacle, as shown in FIG. 1. As the mechanism 12 moves from left to right, the current may first be blocked by the right edge of the mechanism 12, may then be zero for a short distance, and finally may return to full value as the left edge of the mechanism moves out of the way. The drop in current at the left can be a result of the second term on the right of equation (6), showing the effect of the right edge of the mechanism 12 blocking the beam 14. At this point, the angle from the sample cup 18 to the left edge of the mechanism 12 can be much greater than to the right edge; the density ρ at this angle is zero, so the first term on the right in equation (6) may make no contribution. Similarly, when the current recovers, it can be the effect of the left edge moving out of the way, corresponding to the first term on the right hand side of equation (6). At this point the angle from the sample cup 18 to the right edge of the mechanism 12 can be large enough in magnitude that the density ρ at this angle, and hence the second term on the right hand side of equation (6), can be zero.

In this case, there will then be no more than one unknown current density at each mechanism 12 position (at least one of the two terms will always be zero), and the density can be calculated directly at a position by dividing the derivative of sample cup current by the subtended angle $d\theta_{left}$ or $d\theta_{right}$, corresponding to the unknown current density.

Figure 2B:
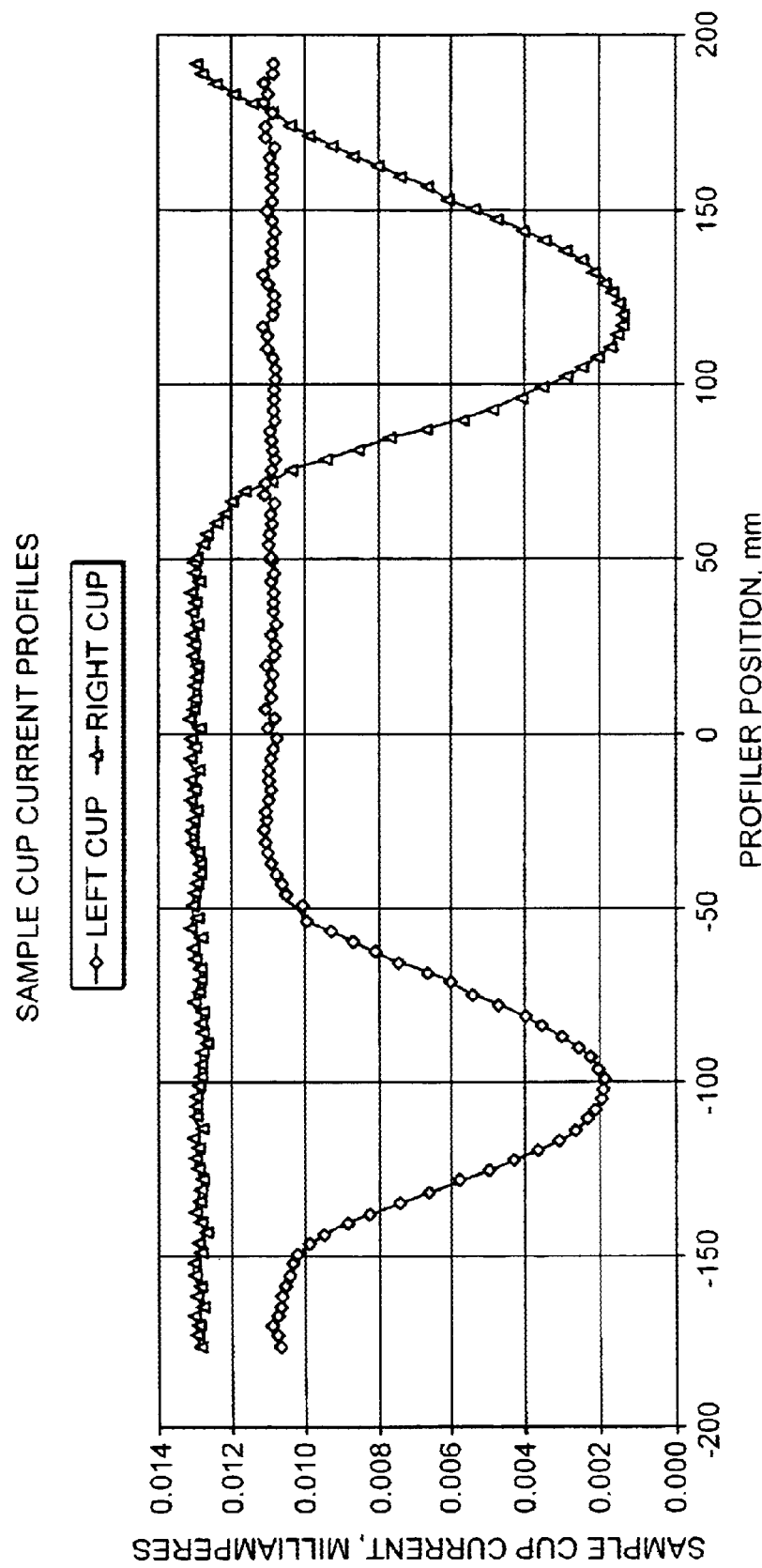

If the beam 14 has a range of divergence wider than the angle subtended by the mechanism 12, then the current may not go to zero, as illustrated in FIG. 2b, and there may be some range of positions for which both edges of the mechanism 12 are intercepting beam that would otherwise be measured by the sample cup 18, i.e. for which equation (6) may have contributions from both terms on the right hand side. In this case, there may be two unknown current densities at a mechanism 12 position, so the densities cannot be calculated directly as in the previous paragraph. The range of angles in the beam 14 can be determined from the range of mechanism 12 positions over which the sample cup current is affected by the mechanism 12. The current density profile over this range of angles can be assumed to be representable by a piecewise linear curve with breakpoints equally spaced in angle across the range. The density at any angle may then be a linear combination of the densities at the two breakpoints that bracket it, and so may be also a linear combination of all the breakpoint densities (with all coefficients but two equal to zero). For example, if the angle $\theta_{left,m}$ from the sample cup 18 to the left edge of the mechanism 12 when the mechanism 12 is at position m lies between breakpoints $\theta_i$ and $\theta_{i+1}$, then the current density at $\theta_{left,m}$ can be expressed in terms of the breakpoint densities $\rho_i$ and $\rho_{i+1}$ as:

$$\rho_{left,m} = \frac{\rho_i(\theta_{i+1} - \theta_{left,m}) + \rho_{i+1}(\theta_{left,m} - \theta_i)}{\theta_{i+1} - \theta_i}. \quad (7)$$

If, at the same mechanism 12 position m, the angle $\theta_{right,m}$ from the sample cup to the right edge of the mechanism lies between breakpoints $\theta_j$ and $\theta_{j+1}$, then the current density at $\theta_{right,m}$ can be expressed in terms of the breakpoint densities $\rho_j$ and $\rho_{j+1}$ as:

$$\rho_{right,m} = \frac{\rho_j(\theta_{j+1} - \theta_{right,m}) + \rho_{j+1}(\theta_{right,m} - \theta_j)}{\theta_{j+1} - \theta_j}. \quad (8)$$

Within the range of mechanism 12 positions over which the sample cup 18 current is affected by the mechanism 12, one can then use these current densities in equation (6) to express the derivative of the sample cup current at each mechanism 12 position as a linear combination of the breakpoint densities. At mechanism 12 position m, the derivative can be expressed as:

$$\left.\frac{dI}{dx}\right|_m = d\theta_{left,m}\left[\frac{\rho_i(\theta_{i+1} - \theta_{left,m}) + \rho_{i+1}(\theta_{left,m} - \theta_i)}{\theta_{i+1} - \theta_i}\right] - \quad (9)$$
$$d\theta_{right,m}\left[\frac{\rho_j(\theta_{j+1} - \theta_{right,m}) + \rho_{j+1}(\theta_{right,m} - \theta_j)}{\theta_{j+1} - \theta_j}\right]$$

Here, the derivative at mechanism 12 position m is a linear combination of the breakpoint densities $\theta_i$, $\theta_{i+1}$, $\theta_j$, and $\theta_{j+1}$. More generally, the derivative can be expressed as a linear combination of all N breakpoint densities:

$$\left.\frac{dI}{dx}\right|_m = \sum_{i=1}^{N} \alpha_{im}\rho_i, \quad (10)$$

with all coefficients $\alpha_{im}$ zero except the four corresponding to the four breakpoints, which bracket the two angles $\theta_{left,m}$ and $\theta_{right,m}$. In equation (9), the coefficient $\alpha_{j+1,m}$ is the coefficient of $\rho_{j+1}$ and would be given by:

$$\alpha_{j+1,m} = -d\theta_{right,m}\frac{(\theta_{right,m} - \theta_j)}{(\theta_{j+1} - \theta_j)}. \quad (11)$$

There will be a total of M equations of the form of (9), which can each more generally be expressed in the form (10), one for each mechanism 12 position in the range of positions for which the mechanism 12 intercepts beam 14 current that would otherwise reach the sample cup 18. At each position m, the coefficients $\alpha_{im}$ will be functions of the two angles $\theta_{left,m}$ and $\theta_{right,m}$ and of the two subtended angles $d\theta_{left,m}$ and $d\theta_{right,m}$, from the sample cup 18 to that position, as indicated in equation (9). A least-squares fit or other numerical analysis technique can then be used to determine the set of N breakpoint densities pi which best match these M derivatives of sample cup 18 current as a function of mechanism 12 position.

In a least-squares analysis, the best choice of the $\rho_i$ is that which minimizes the sum of the squares of the differences between the left and right side of each of the M equations (10). The quantity to be minimized is:

$$\chi^2 = \sum_{m=1}^{M}\left\{\left.\frac{dI}{dx}\right|_m - \sum_{i=1}^{N}\alpha_{im}\rho_i\right\}^2. \quad (12)$$

The only variables in this equation are the $\rho_i$. The quantity $\chi^2$ is minimized at the point (set of $\rho_i$) where the derivative of $\chi^2$ with respect to each of the $\rho_i$ is zero. For $\rho_j$ the requirement is:

$$\frac{d\chi^2}{d\rho_j} = 0 = -2\sum_{m=1}^{M}\left\{\left.\frac{dI}{dx}\right|_m - \sum_{i=1}^{N}\alpha_{im}\rho_i\right\}\frac{d}{d\rho_j}\left\{\sum_{i=1}^{N}\alpha_{im}\rho_i\right\}, \text{ or}$$

$$\frac{d\chi^2}{d\rho_j} = 0 = -2\sum_{m=1}^{M}\left\{\left.\frac{dI}{dx}\right|_m - \sum_{i=1}^{N}\alpha_{im}\rho_i\right\}\alpha_{jm}.$$

This can be rearranged to:

$$\sum_{i=1}^{N}\rho_i\left[\sum_{m=1}^{M}\alpha_{im}\alpha_{jm}\right] = \sum_{m=1}^{M}\alpha_{jm}\left.\frac{dI}{dx}\right|_m. \quad (13)$$

The full set of N simultaneous equations that must be solved to determine the $\rho_i$ can be expressed in matrix form as:

$$\begin{bmatrix} \sum_{m=1}^{M}\alpha_{1m}\alpha_{1m} & \sum_{m=1}^{M}\alpha_{1m}\alpha_{2m} & \cdots & \sum_{m=1}^{M}\alpha_{1m}\alpha_{Nm} \\ \sum_{m=1}^{M}\alpha_{2m}\alpha_{1m} & \sum_{m=1}^{M}\alpha_{2m}\alpha_{2m} & \cdots & \\ \vdots & \vdots & \vdots & \vdots \\ \sum_{m=1}^{M}\alpha_{Nm}\alpha_{1m} & \cdots & & \sum_{m=1}^{M}\alpha_{Nm}\alpha_{Nm} \end{bmatrix} \begin{bmatrix} \rho_1 \\ \rho_2 \\ \vdots \\ \rho_N \end{bmatrix} = \begin{bmatrix} \sum_{m=1}^{M}\alpha_{1m}\left.\frac{dI}{dx}\right|_m \\ \sum_{m=1}^{M}\alpha_{2m}\left.\frac{dI}{dx}\right|_m \\ \vdots \\ \sum_{m=1}^{M}\alpha_{Nm}\left.\frac{dI}{dx}\right|_m \end{bmatrix}$$

This set of equations can be solved by a variety of techniques, including Gauss-Jordan Elimination.

The current densities $\rho$ in the equations above are functions of $x_{corner}$, $\theta$, and $z_{corner}$, where ($x_{corner}$, $z_{corner}$) are the coordinates of the corner of the mechanism defining the angle $\theta$. Since different corners of the mechanism 12, at different z coordinates, may define the limiting angles at different mechanism 12 positions and on opposite sides (left and right) of the mechanism 12, the densities determined may be applicable to a number of different z coordinates. Generally, it is desirable to determine current density on a plane at a particular z coordinate, or at a particular orientation with respect to the z-axis. In order to do this, it is necessary to transform the densities determined in the equations above to this common plane, which might be a plane of particular interest, such as the plane of the wafer being implanted in the case of an ion implanter.

It is noted that the above derivations may require that individual elements of the beam 14 travel in straight lines and do not interact with other. This may correspond to situations where external electric or magnetic fields or internal space-charge forces in the beam 14 in the region between the moving mechanism 12 and the sample cup(s) 18 are either nonexistent or small enough that these limitations may be reasonable. Thus, the angle θ will be constant for a given element of beam 14, while the positions at two different z coordinates will be related by:

$$x(z_2)=x(z_1)+(z_2-z_1)\tan\theta. \qquad (14)$$

The numerical value of the current density is unchanged in the transformation. This can be seen by considering an elemental area dxdθ between x and x+dx and between θ+dθ at $z_1$. The current within this element is ρdxdθ. Under the transformation of coordinates, the two corners of the element at θ are both transposed through a distance $(z_2-z_1)\tan\theta$, and their spacing remains dx. The two corners of the element at θ+dθ, are both transposed through a distance $(z_2-z_1)\tan(\theta+d\theta)$, and their spacing also remains dx. The element dxdθ is transposed from a square element into a parallelogram with the same base and height, and hence with the same area. Since the current contained in this element must be the same before and after the transformation, and since the areas are the same, the current density is also the same. Therefore, the only quantity which changes in the transformation of the emittance data from one z coordinate to another is the x coordinate at which the density is valid.

Figure 3:
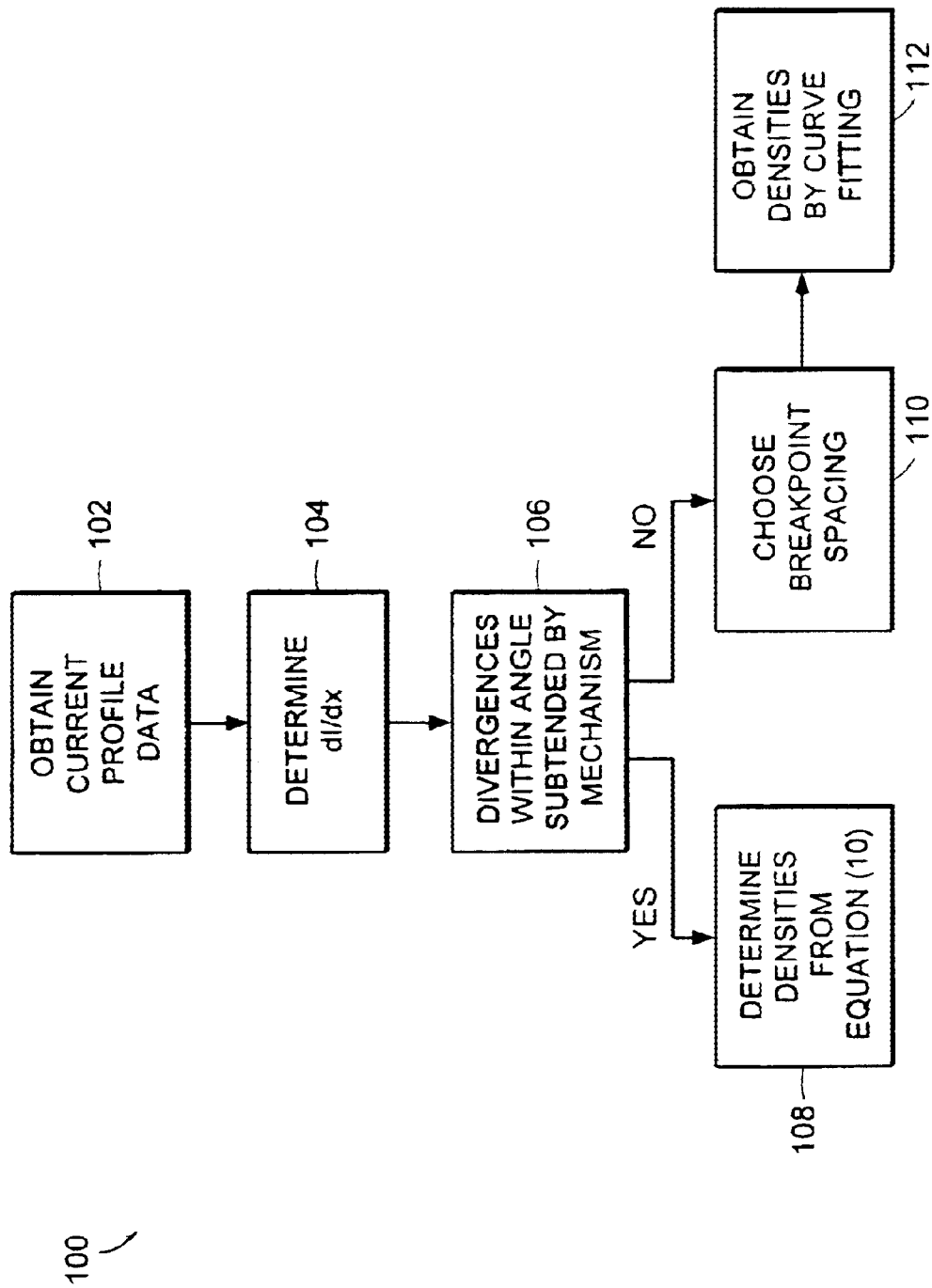
FIG. 3 is a flow chart of a method to obtain the beam current density (emittance).

FIG. 3 provides a flow chart to illustrate a preferred embodiment of a method 100 for determining the beam current density in a charged particle transport system based on position and angle, i.e., the ion beam emittance, using the relationships described previously. Profile data for the device, as illustrated in FIG. 2a, is obtained at 102 and its derivative dI/dx can be numerically determined at 104. A variety of techniques for numerical determination of derivatives are known in the art and may be used herein.

Based on the obtained data, it can be determined at 106 whether, within the overall range of mechanism 12 positions over which the beam 14 current measured at the sample cup 18 varies as a function of position, there is some range of mechanism 12 positions for which the range of divergences in the beam 14 that would otherwise reach the sample cup 18 will fall within the angle subtended by the two edges of the mechanism 12 at the sample cup 18, i.e. within the range of angles between the lines 22 and 24 in FIG. 1. This corresponds to the mechanism 12 blocking all current reaching the sample cup 18 in a range of mechanism 12 positions, if the mechanism 12 is an obstacle, or blocking no current reaching the sample cup 18 in a range of mechanism 12 positions, if the mechanism 12 is an aperture. This can be accomplished by determining if the current profile is constant (either at a zero value, as previously described in relation to FIG. 2a. in the case of an obstacle, or at the maximum positive value in the case of an aperture) over a range of positions away from the extremes of mechanism 12 position and separated from the regions of constant current at the extremes by ranges of position where the current is varying as a function of position.

If there is such a range of positions for which the range of divergences in the beam 14 that would otherwise reach the sample cup 18 will fall within the angle subtended by the two edges of the mechanism at the sample cup, the current density can be determined directly from the derivative of sample cup current with respect to position, dI/dx, using equation (6). As noted above, for positions to the left of the region of constant values, $\rho_{left\ edge}$ may be zero and only the right edge portion of equation (6) is applicable, therefore:

$$\rho = \rho_{right \atop edge} = -\left(\frac{dI}{dx}\right)\bigg/ d\theta_{right \atop edge} \qquad (10a)$$

Similarly, for positions to the right of the region of constant values:

$$\rho = \rho_{left \atop edge} = \left(\frac{dI}{dx}\right)\bigg/ d\theta_{left \atop edge} \qquad (10b)$$

Using equations (10a) and (10b) as appropriate for the position x, the beam current density ρ as a function of angle θ can be determined at 108, where dθ can be determined from equation (8) and θ can be determined from equation (5).

For the case where, within the overall range of mechanism 12 positions over which the beam 14 current measured at the sample cup 18 varies as a function of position, there is no range of positions for which the range of divergences in the beam 14 that would otherwise reach the sample cup 18 will fall within the angle subtended by the two edges of the mechanism 12 at the sample cup 18, there can be two unknown current densities at a position, $\rho_{left}$ and $\rho_{right}$. The range of angles in the beam 14 current reaching the sample cup 18 can be determined from the range of mechanism 12 positions over which the current is affected by the mechanism 12. The density ρ over this range may be determined using the equations developed previously and one or more curve fitting techniques known in the art, e.g., least squares via trust region, Levenberg-Marquardt, or Gauss-Newton algorithms, weighted least squares, or robust fitting procedures such as bisquare or least absolute residuals. In the embodiment of FIG. 3, a least squares approach can be used.

It can be seen that the current density over the range of angles in the beam 14 current reaching the sample 18 cup can be represented by a piecewise linear curve with breakpoints equally spaced across the range of angles. The spacing of breakpoints can be chosen at 110 to provide the predetermined level of accuracy and considering the increased processing required for more closely spaced breakpoints, as well as the requirement that the number of breakpoints must be less than or equal to the number of mechanism 12 positions for which current is affected by the mechanism 12, i.e., the number of unknowns must be less than or equal to the number of equations. As noted previously, the derivative of sample cup 18 current at a mechanism 12 position can be expressed as a linear combination of the breakpoint current densities. Thus, a least squares fit at 112 can determine the set of current densities that best match the derivative in equation (6) over the range of positions for which the mechanism 12 intercepts beam 14 current that would otherwise reach the sample cup 18.

The methods and systems described herein are not limited to a particular hardware or software configuration, and may find applicability in many computing or processing environments. The methods and systems can be implemented in hardware or software, or a combination of hardware and software. The methods and systems can be implemented in one or more computer programs executing on one or more programmable computers that include a processor, a storage medium readable by the processor (including volatile and non-volatile memory and/or storage elements), one or more input devices, and one or more output devices.

The computer program(s) is preferably implemented using one or more high level procedural or object-oriented programming languages to communicate with a computer system; however, the program(s) can be implemented in assembly or machine language, if desired. The language can be compiled or interpreted.

The computer program(s) can be preferably stored on a storage medium or device (e.g., CD-ROM, hard disk, or magnetic disk) readable by a general or special purpose programmable computer for configuring and operating the computer when the storage medium or device is read by the computer to perform the procedures described herein. The system can also be considered to be implemented as a computer-readable storage medium, configured with a computer program, where the storage medium so configured causes a computer to operate in a specific and predefined manner.

While the methods and systems have been disclosed in connection with the preferred embodiments shown and described in detail, various modifications and improvements thereon will become readily apparent to those skilled in the art. The methods can be used to determine the mean direction of the beam in an implanting device or other charged particle transport system and for setting magnets or other steering devices to ensure proper orientation of the beam with respect to focusing elements or target surfaces. The methods also may be used for diagnosis and evaluation of the performance of an implanting device or other charged particle transport system. As an example, the methods may sense a large divergence that may be indicative of poor space-charge neutralization in some section of an ion beamline. Accordingly, the spirit and scope of the present methods and systems are to be limited only by the following claims.

What is claimed is:

1. A method for determining beam emittance of a beam of charged particles at a plane in a charged particle transport system, comprising:

obtaining a beam current profile wherein obtaining the current profile comprises obtaining the beam current passing a moving mechanism of the charged particle transport system and reaching a current sensor located downstream of the moving mechanism, as a function of the position of the moving mechanism;

determining a derivative of the current profile wherein determining beam current density comprises performing curve fitting techniques on the derivative of the beam current profile over a range of positions for which the mechanism intercepts beam current that would otherwise reach the current sensor; and determining a beam current density ρ based on the derivative, the beam current density corresponding to the beam emittance.

2. The method of claim 1, wherein determining the derivative comprises:

determining the derivative with respect to the position of the moving mechanism, and determining the derivative numerically.

3. The method of claim 1, wherein determining the derivative comprises determining the derivative by a relationship:

$$\frac{dI}{dx} = \rho_{left\,edge} * d\theta_{left\,edge} - \rho_{right\,edge} * d\theta_{right\,edge},$$

where:

$\rho_{left\,edge}$ and $\rho_{right\,edge}$ are current densities in the beam passing left and right edges, respectively, of the mechanism, and where $d\theta_{left\,edge}$ and $d\theta_{right\,edge}$ are angles subtended to the left and right edges of the mechanism, respectively, by the current sensor at the sample plane.

4. The method of claim 1, wherein determining beam current density comprises determining whether, within an overall range of mechanism positions over which the beam current measured at the current sensor varies as a function of position, there is some range of mechanism positions for which a range of divergences in the beam that would otherwise reach the current sensor will fall within an angle subtended by edges of the mechanism at the current sensor.

5. The method of claim 4, wherein determining the derivative, when there is some range of mechanism positions for which the range of divergences in the beam that would otherwise reach the current sensor falls within the angle subtended by edges of the mechanism at the current sensor, comprises determining the derivative by a relationship:

$$\frac{dI}{dx} = -\rho_{right\,edge} * d\theta_{right\,edge}$$

for mechanism positions left of the range of mechanism positions, for which beam current that would otherwise reach the current sensor is intercepted by a right edge of the mechanism;

$$\frac{dI}{dx} = \rho_{left\,edge} * d\theta_{left\,edge}$$

for mechanism positions right of the range of mechanism positions, for which the beam current that would otherwise reach the current sensor is intercepted by a left edge of the mechanism, where:

$\rho_{left\,edge}$ and $\rho_{right\,edge}$ are current densities in the beam passing the left and right edges, respectively, of the mechanism;

$d\theta_{left\,edge}$ and $d\theta_{right\,edge}$ are the angles subtended by the current sensor at the sample plane to the left and right edges of the mechanism, respectively.

6. The method of claim 1, wherein the derivative is determined numerically.

7. The method of claim 1, wherein the derivative is given by the relationship:

$$\frac{dI}{dx} = \rho_{\text{left} \atop \text{edge}} * d\theta_{\text{left} \atop \text{edge}} - \rho_{\text{right} \atop \text{edge}} * d\theta_{\text{right} \atop \text{edge}},$$

where:

$\rho_{\text{left} \atop \text{edge}}$ and $\rho_{\text{right} \atop \text{edge}}$ are current densities in the beam passing left and right edges, respectively, of the moving mechanism of the charged particle transport system, and where $d\theta_{\text{left} \atop \text{edge}}$ and $d\theta_{\text{right} \atop \text{edge}}$ are angles subtended by the current sensor to the left and right edges of the mechanism, respectively.

8. The method of claim 7, wherein the derivative is determined numerically.

9. The method of claim 1, wherein determining beam current density comprises determining whether, within an overall range of mechanism positions over which the beam current measured at the current sensor at the sample plane varies as a function of position, there is some range of mechanism positions for which a range of divergences in the beam that would otherwise reach the current sensor will fall within an angle subtended by edges of the mechanism at the current sensor.

10. The method of claim 9, wherein determining the derivative, when there is some range of mechanism positions for which the range of divergences in the beam that would otherwise reach the current sensor will fall within the angle subtended by edges of the mechanism at the current sensor, comprises determining the derivative by a relationship:

$$\frac{dI}{dx} = -\rho_{\text{right} \atop \text{edge}} * d\theta_{\text{right} \atop \text{edge}}$$

for mechanism positions left of the range of mechanism; positions, for which beam current that would otherwise reach the current sensor is intercepted by a right edge of the mechanism;

$$\frac{dI}{dx} = \rho_{\text{left} \atop \text{edge}} * d\theta_{\text{left} \atop \text{edge}}$$

for mechanism positions right of the range of mechanism positions, for which the beam current that would otherwise reach the current sensor is intercepted by a left edge of the mechanism, where $\rho_{\text{left} \atop \text{edge}}$ and $\rho_{\text{right} \atop \text{edge}}$ are current densities in the beam passing the left and right edges, respectively, of the mechanism;

$d\theta_{\text{left} \atop \text{edge}}$ and $d\theta_{\text{right} \atop \text{edge}}$ are the angles sub tended by the current sensor to the left and right edges of the mechanism, respectively.

11. The method of claim 9, wherein determining beam current density, when there is no range of mechanism positions for which the range of divergences in the beam that would otherwise reach the current sensor will fall within the angle subtended by the edges of the mechanism at the current sensor, comprises performing curve fitting techniques on the derivative of the beam current profile over a range of positions for which the mechanism intercepts beam current that would otherwise reach the current sensor.

12. The method of claim 1, wherein determining beam current density comprises performing curve fitting techniques on the derivative of the beam current profile over a range of positions for which the mechanism intercepts beam current that would otherwise reach the current sensor at the sample plane.

13. The method of claim 12, wherein curve fitting comprises:

expressing the derivative of bean current with respect to mechanism position as a linear combination of current densities at selected breakpoints equally spaced over a range of angles in the beam reaching the current sensor and applying a least squares procedure to the beam current derivative so expressed using beam current profile data to determine a set of current densities best matching the derivative over the range of positions for which the mechanism intercepts beam current that would otherwise reach the current sensor plane.

14. The method of claim 12, wherein curve fitting comprises using at least one of a procedure of least squares, weighted lest squares, bisquare and absolute residuals.

15. A method for determining beam emittance of a beam of charged particles at a plane in a charged particle transport system, comprising:

obtaining a beam current profile for beam current passing a moving mechanism of the charged particle transport system and reaching a sampling Faraday cup located downstream of the moving mechanism, as a function of the position of the moving mechanism;

numerically determining a derivative of the current profile with respect to the position of the mechanism;

determining whether, within an overall range of mechanism positions over which the beam current measured at the sample cup varies as a function of position, there is some range of mechanism positions for which the range of divergences in the beam that would otherwise reach the sample cup will fall within an angle subtended by edges of the mechanism at the sample cup;

determining based on the derivative, a beam current density ρ corresponding to the beam emittance, when there is some range of mechanism positions for which the range of divergences in the beam that would otherwise reach the sample cup will fall within the angle subtended by the edges of the mechanism at the sample cup; and determining, when there is no range of mechanism positions for which the range of divergences in the beam that would otherwise reach the sample cup will fall within the angle subtended by the edges of the mechanism at the sample cup, the beam current density by performing curve fitting techniques on the derivative of the beam current profile over a range of positions for which the mechanism intercepts beam current that would otherwise reach the sample cup.

16. The apparatus of claim 15, when there is some range of mechanism positions for which the range of divergences in the beam that would otherwise reach the sample cup will fall within the angle subtended by the edges of the mechanism at the sample sup, wherein the derivative is given by the relationship:

$$\frac{dI}{dx} = -\rho_{right \atop edge} * d\theta_{right \atop edge}$$

for mechanism positions left of the range, for which beam current that would otherwise reach the sample cup is intercepted by a right edge of the mechanism;

$$\frac{dI}{dx} = \rho_{left \atop edge} * d\theta_{left \atop edge}$$

for mechanism positions right of this range, for which the beam current that would otherwise reach the sample cup is intercepted by a left edge of the mechanism, where $$\rho_{left \atop edge} \text{ and } \rho_{right \atop edge}$$

are current densities in the beam passing the left and right edges, respectively, of the mechanism, and where $$d\theta_{left \atop edge} \text{ and } d\theta_{right \atop edge}$$

are the angles subtended by the downstream current sensor to the left and right edges of the mechanism, respectively.

17. The method of claim 15, wherein curve fitting comprises:
expressing the derivative of the beam current with respect to mechanism position as a linear combination of beam current densities at selected breakpoints equally spaced over the range of angles in the beam reaching the sample cup, and
applying a least squares procedure to the beam current derivative so expressed using the numerically determined derivative of the beam current profile data to determine a set of beam current densities best matching the derivative over the range of positions for which the mechanism intercepts beam current that would otherwise reach the sample cup.

18. A computer program tangibly stored on a computer-readable medium and operable to cause a computer to enable a user to determine beam emittance of a beam of charged particles at a plane in a charged particle transport system, the computer program comprising instructions to:
obtain a beam current profile for beam current passing a moving, straight-edged mechanism of the charged particle transport system;
determine a derivative of the current profile;
determine a beam current density ρ based on of the derivative, the beam current density corresponding to the beam emittance; and
determine if there is some range of mechanism positions for which a range of divergences in the beam that would otherwise reach the current sensor will fall within an angle subtended by edges of the mechanism at the current sensor.

19. The computer program of claim 18, comprising instructions to determine current densities from the derivative of the beam current profile, when there is some range of mechanism positions for which the range of divergences in the beam that would otherwise reach the current sensor will fall within the angle subtended by the edges of the mechanism at the current sensor, by the relationship:

$$\frac{dI}{dx} = -\rho_{right \atop edge} * d\theta_{right \atop edge}$$

for mechanism positions left of the range, for which beam current that would otherwise reach the current sensor is intercepted by a right edge of the mechanism;

$$\frac{dI}{dx} = \rho_{left \atop edge} * d\theta_{left \atop edge}$$

for mechanism positions right of the range, for which the beam current that would otherwise reach the current sensor is intercepted by a left edge of the mechanism, where $$\rho_{left \atop edge} \text{ and } \rho_{right \atop edge}$$

are current densities in the beam passing the left and right edges, respectively, of the mechanism, and where $$d\theta_{left \atop edge} \text{ and } d\theta_{right \atop edge}$$

are the angles subtended to the left and right edges of the mechanism, respectively, by the current sensor.

20. The computer program of claim 18, comprising instructions to determine beam current density when there is no range of mechanism positions for which the range of divergences in the beam that would otherwise reach the current sensor will fall within the angle subtended by the edges of the mechanism at the current sensor by performing curve fitting techniques on the derivative of the beam current over a range of positions for which the mechanism intercepts beam current that would otherwise reach the current sensor.

21. The computer program of claim 20, comprising instructions to:
express the derivative of the beam current profile with respect to mechanism position as a linear combination of beam current densities at selected breakpoints equally spaced over the range of angles in the beam reaching the current sensor; and
apply a least squares procedure to the beam current profile derivative so expressed using a numerical derivative of the beam current profile data to determine a set of beam current densities best matching the derivative over the range of positions for which the mechanism intercepts beam current that would otherwise reach the current sensor.

22. The computer program of claim 20, comprising instructions to determine the derivative using at least one of a procedure of central differences, forward differences, backward differences and Taylor series expansion.

23. A system to determine beam emittance of a beam of charged particles at a plane in a charged particle transport system, comprising:
- a straight-edged mechanism capable of being moved from a starting position at which neither edge of the mechanism intercepts current in the beam, through a range of intermediate position at one or more of which one or more edges of the mechanism intercept current in the beam, to a final position at which neither edge of the mechanism intercepts current in the beam;
- at least one sampling Faraday cup to measure beam current passing the mechanism and reaching the position of the sampling Faraday cup on a plane downstream of the mechanism;
- a derivative module to determine a derivative of measured sampling Faraday cup current with respect to mechanism position, as a function of mechanism position; and
- an analysis module to determine a beam current density ρ as a function of position and direction based on of the derivative, the beam current density corresponding to the beam emittance;
- wherein the analysis module includes a curve fitting module to determine beam current density, when there is no mechanism position for which the range of divergences in the beam that would otherwise reach the Faraday cup will fall within the angle subtended by the two edges of the mechanism at the Faraday cup, by performing curve fitting techniques on the derivative of the beam current profile over a range of positions for which the mechanism intercepts beam current that would otherwise teach the Faraday cup.

24. The system of claim 23, wherein the analysis module determines beam current density ρ as a function of position and direction when, within an overall range of mechanism positions over which the beam current measured at the Faraday cup vaies as a function of position, there is some range of mechanism positions for which a range of divergences in the beam that would otherwise reach the Faraday cup will fall within an angle subtended by edges of the mechanism at the Faraday cup, by the relationship:

$$\frac{dI}{dx} = -\rho_{right \atop edge} * d\theta_{right \atop edge}$$

for mechanism positions left of the range, for which beam current that would otherwise reach the Faraday cup is intercepted by a right edge of the mechanism;

$$\frac{dI}{dx} = \rho_{left \atop edge} * d\theta_{left \atop edge}$$

for mechanism positions right of this, for which the beam current that would otherwise reach the Faraday cup is intercepted by a left edge of the mechanism, where $$\rho_{left \atop edge} \text{ and } \rho_{right \atop edge}$$

are current densities in the beam passing the left and right edges, respectively, of the mechanism, and where $$d\theta_{left \atop edge} \text{ and } d\theta_{right \atop edge}$$

are the angles subtended by the Faraday cup to the left and right edges of the mechanism.

25. The system of claim 23, wherein the curve fitting module comprises:
- a breakpoint module to express the derivative of the beam current profile as a linear combination of beam current densities at selected breakpoints equally spaced over the range of angles in the beam reaching the Faraday cup; and
- a least squares module to apply a least squares procedure to the beam current profile derivative so expressed suing a numerical derivative of the beam current profile data to determine a set of current densities best matching the derivative over the range of positions for which the mechanism intercepts beam current that would otherwise reach the Faraday cup.

26. The system of claim 23, wherein the curve fitting module comprises at least one of a least squares module, a weighted lest squares module, a bisquare module and an absolute residuals module.

* * * * *